United States Patent
Jonckheere et al.

(10) Patent No.: US 10,359,694 B2
(45) Date of Patent: Jul. 23, 2019

(54) LITHOGRAPHIC MASK FOR EUV LITHOGRAPHY

(71) Applicant: IMEC VZW, Leuven (BE)

(72) Inventors: Rik Jonckheere, Muizen (BE); Koen D'have, Leuven (BE)

(73) Assignee: IMEC VZW, Leuven (BE)

( * ) Notice: Subject to any disclaimer, the term of this patent is extended or adjusted under 35 U.S.C. 154(b) by 132 days.

(21) Appl. No.: 15/691,462

(22) Filed: Aug. 30, 2017

(65) Prior Publication Data

US 2018/0059529 A1 Mar. 1, 2018

(30) Foreign Application Priority Data

Aug. 31, 2016 (EP) .................................... 16186625

(51) Int. Cl.
| | |
|---|---|
| G03F 1/22 | (2012.01) |
| G03F 1/42 | (2012.01) |
| G03F 1/54 | (2012.01) |
| H01L 21/68 | (2006.01) |

(52) U.S. Cl.
CPC .................. *G03F 1/22* (2013.01); *G03F 1/42* (2013.01); *G03F 1/54* (2013.01); *H01L 21/682* (2013.01)

(58) Field of Classification Search
CPC ................. G03F 1/22; G03F 1/42; G03F 1/54
USPC ....................................................... 430/5, 22
See application file for complete search history.

(56) References Cited

U.S. PATENT DOCUMENTS

| | | | | |
|---|---|---|---|---|
| 7,534,532 | B2 * | 5/2009 | Yan | ................. B82Y 10/00 |
| | | | | 430/5 |
| 9,134,602 | B2 * | 9/2015 | Chu | ...................... G03F 1/24 |
| 9,250,513 | B2 * | 2/2016 | Yu | ......................... G03F 1/72 |

OTHER PUBLICATIONS

Kagalwalla, Abde Ali et al., "Comprehensive Defect Avoidance Framework for Mitigating Extreme Ultraviolet Mask Defects", Journal of Micro/Nanolithography, MEMS and MOEMS, vol. 13(4), Oct.-Dec. 2014, pp. 12 pages.

* cited by examiner

*Primary Examiner* — Christopher G Young
(74) *Attorney, Agent, or Firm* — McDonnell Boehnen Hulbert & Berghoff LLP

(57) ABSTRACT

The disclosure is related to a lithographic mask for EUV lithography, to a method for producing the mask, to a method for printing a pattern with the mask, to a stepper/scanner configured to print a pattern with the mask as well as to a computer-implemented method for calculating a deformation of the pattern. The mask comprises an absorber pattern, which is intentionally deformed in the 2-dimensional plane of the EUV mask, with respect to the intended pattern. The deformation of the pattern is based on a previous measurement of the location of multilayer defects on the blank, and calculated so that in the deformed pattern, a maximum of multilayer defects are covered by absorber material. When the pattern is subsequently printed on a semiconductor wafer in a stepper/scanner, the scanner operation is modulated so that the pattern deformation is not reproduced on the wafer.

15 Claims, 3 Drawing Sheets

LITHOGRAPHIC MASK FOR EUV LITHOGRAPHY

CROSS-REFERENCE TO RELATED APPLICATIONS

The present application is a non-provisional patent application claiming priority to European Patent Application No. EP 16186625.6, filed Aug. 31, 2016, the contents of which are hereby incorporated by reference.

FIELD OF THE DISCLOSURE

The present disclosure is related to semiconductor processing, in particular to the use of Extreme Ultraviolet (EUV) lithography for producing integrated circuits.

BACKGROUND

Semiconductor processing includes many lithography steps, wherein a pattern defined on a lithographic mask (also referred to as the reticle) is illuminated by a light source, resulting in the printing of the pattern on a photoresist film deposited on a layer stack that is built up layer by layer on a semiconductor wafer.

The reduction of feature sizes in present-day integrated circuits has commanded an evolution in terms of the applied lithography. One development is the move from Deep Ultraviolet (DUV) light wavelengths towards EUV. As materials are too absorbing at the extremely small wavelengths applied in EUV lithography (typically 12-15 nm), EUV lithography relies on reflectivity rather than transparency of the mask and optics. The masks are produced from a substrate onto which a multilayer stack is deposited, thereafter referred to as an EUV blank or multilayer blank. The material (e.g., silicon and molybdenum) and the thickness of the layers are chosen so that EUV light reflected off the subsequent interfaces interferes constructively. An absorber layer is deposited on top of the blank, and subsequently patterned based on the intended mask pattern that is to be transferred onto a wafer through the lithography process. The areas where no absorber is present (referred to as the 'clear' areas) reflect the incoming light. The reflected light is focused through a mirror system onto a semiconductor wafer.

During manufacturing of the blank, small particles may become trapped within the layers, imperfections may occur in the layers themselves, or there may be imperfections of the substrate onto which the multilayer is deposited, all leading to microscopic bump- or pit-type defects in the multilayer. Such faults manifest themselves as blank defects, also referred to as "multilayer (ML) defects" or "phase defects". The depth or height of these defects is in the order of nanometers, which initiates a local disturbance of the constructive interference referred to above. In this way, ML defects may cause considerable printing errors. In the lateral direction these defects are typically of the order of the critical half pitch of the pattern or larger.

Blank manufacturers have made efforts to minimize the occurrence of ML defects. Nevertheless, the appearance of a small residual number of ML defects is currently considered to be unavoidable in state-of-the-art blank manufacturing. Therefore techniques have been developed to mitigate the influence of the ML defects on the printed pattern. An ML defect avoidance approach consists of shifting the pattern on the blank, thereby covering a maximum number of defects by absorber material, so that they have no impact on the printed pattern. This technique is referred to as 'pattern shift'.

In document "Comprehensive defect avoidance framework for mitigating extreme ultraviolet mask defects", Kagalwalla et al, Journal of Micro/Nanolithography, MEMS and MOEMS, 13(4), 043005 (October-December 2014), three ways of shifting the pattern are described: shifting the entire pattern with respect to the blank (translation of the pattern), rotating the entire pattern, or in case the mask contains multiple patterns re-arranging the "floorplan", i.e. shifting the individual patterns with respect to each other.

While such techniques allow to mitigate the influence of a number of defects, they are unable to produce a mask wherein potentially all ML defects are neutralized. Defect coverage yield is heavily dependent on a number of parameters, including the pitch of the mask pattern, the pattern density (=amount of clear), the number of blank defects, the lateral defect sizes and the amount of uncritical parts in the design. The success rate of the technique is therefore limited and the percentage covered stays relatively low.

SUMMARY

The examples and embodiments described herein are relate to an EUV mask, a method for manufacturing the mask, a method for applying the mask, a stepper/scanner for use with the mask, and a computer-implemented method for calculating an absorber pattern on the mask, as disclosed in the appended claims.

The examples and embodiments described herein are thus firstly relate to a mask for printing a pattern of features onto a semiconductor wafer in a stepper/scanner apparatus by EUV lithography, the mask comprising:

a multilayer blank, comprising a plurality of multilayer (ML) defects, the blank further comprising a plurality of reference marks, an absorber pattern positioned in a predefined position with respect to a 2-dimensional coordinate system that is defined by the position of the reference marks, the absorber pattern comprising areas covered by EUV absorber material and areas not covered by the material, the absorber pattern corresponding to the intended pattern of features (the intended pattern being the pattern as it is intended to be printed on the wafer), i.e. the absorber pattern comprising the same features as the intended pattern, wherein the absorber pattern is deliberately deformed on the mask with respect to the intended pattern, so that multiple ML defects are covered by absorber material The absorber pattern may furthermore be shifted and/or rotated with respect to the 2-dimensional coordinate system. According to example embodiments, the deformation of the absorber pattern is characterized by one or more first or higher order transformations of the coordinate system. The transformations may include at least one second or third order transformation. The coordinate system may be defined by orthogonal X and Y axes. According to an example embodiment, all ML defects that have been detected in the area of the blank corresponding to the pattern are covered by absorber material.

The examples and embodiments described herein are equally relate to a method for producing a mask for EUV lithography, comprising the steps of:

providing a multilayer blank,
detecting a plurality of multilayer defects on the blank,
producing reference marks on the blank, defining a 2-dimensional coordinate system with respect to the reference marks, determining the position of the defects in the 2-dimensional coordinate system, providing a pattern of features that is intended to be printed on a semiconductor wafer, determining an absorber pattern comprising areas covered by EUV absorber material and areas not covered by the material, the absorber pattern corresponding to the pattern of features intended to be printed on the wafer, wherein the absorber pattern is deformed with respect to the intended pattern, so that multiple ML defects in the area of the blank corresponding to the pattern are covered by absorber material, when the absorber pattern is produced on the blank in a predefined position with respect to the 2-dimensional coordinate system, producing the absorber pattern on the blank in the predefined position, registering the deformation of the absorber pattern with respect to the intended pattern in the form of numerical data that represents the deformation in the 2-dimensional coordinate system.

In the example method for producing a mask, the absorber pattern may furthermore be shifted and/or rotated with respect to the 2-dimensional coordinate system. The pattern deformation may furthermore be characterized by one or more first or higher order transformations of the coordinate system. The transformations may include at least one second or third order transformation. The coordinate system may be defined by orthogonal X and Y axes. According to an example embodiment of the method for producing a mask, all of the detected ML defects in the area of the blank corresponding to the pattern are covered by absorber material.

The examples and embodiments described herein are equally relate to a method for producing a print of a pattern of features on a semiconductor wafer, the method comprising the steps of:

providing an EUV stepper/scanner, the stepper/scanner comprising a number of components which are movable relative to each other and relative to other components of the stepper/scanner, which are stationary, mounting an EUV mask according to the invention into a mask holder of the stepper/scanner, mounting a semiconductor wafer into a wafer holder of the stepper/scanner, aligning the wafer and the EUV mask, using numerical data representative of a deliberate deformation of the absorber pattern on the EUV mask, with respect to the intended pattern, to calculate a required path and/or velocity of one or more of the moveable components relative to each other and/or relative to stationary components of the stepper/scanner, so that exposure of the wafer yields a printed pattern on the wafer wherein the deformation does not appear, exposing the wafer whilst subjecting the one or more movable components to the required path and/or velocity.

The examples and embodiments described herein are equally relate to a stepper/scanner for EUV lithography, comprising a number of components which are movable relative to each other and relative to other components of the stepper/scanner, which are stationary, the stepper/scanner furthermore comprising an interface for receiving numerical data representative of a deliberate deformation of an absorber pattern on an EUV mask, and means for calculating a required path and/or velocity of one or more of the movable components relative to other moveable components or relative to stationary components of the stepper/scanner, in order that exposure of the EUV mask held by a mask holder of the stepper/scanner yields a printed pattern on a semiconductor wafer held by a wafer holder of the stepper/scanner, wherein the deformation does not appear in the printed pattern.

The examples and embodiments described herein are equally related to a computer-implemented method for calculating a deformation of an absorber pattern on an EUV mask, comprising the steps of:

receiving data descriptive of a pattern that is intended to be printed on a semiconductor wafer with the use of a stepper/scanner, receiving data descriptive of an EUV blank comprising reference marks and comprising a number of detected ML defects, in particular receiving data related to the position of the detected defects with respect to the reference marks, calculating data which characterize a deformation of the pattern and possibly a translation and/or a rotation of the pattern as a whole, so that when the deformed and possibly translated and/or rotated pattern is produced on the EUV blank, a plurality of the detected defects are covered by absorber material.

The examples and embodiments described herein are also related to computer program for performing the method for calculating a deformation of an absorber pattern on an EUV mask, when the program is run on a computer.

BRIEF DESCRIPTION OF THE FIGURES

The above, as well as additional, features will be better understood through the following illustrative and non-limiting detailed description of example embodiments, with reference to the appended drawings.

All the figures are schematic, not necessarily to scale, and generally only show parts which are necessary to elucidate example embodiments, wherein other parts may be omitted or merely suggested.

DETAILED DESCRIPTION

Example embodiments will now be described more fully hereinafter with reference to the accompanying drawings. That which is encompassed by the claims may, however, be embodied in many different forms and should not be construed as limited to the embodiments set forth herein; rather, these embodiments are provided by way of example. Furthermore, like numbers refer to the same or similar elements or components throughout.

Typically, the pattern that is to be printed on a semiconductor wafer by EUV lithography is reproduced and magnified on the EUV mask in the form of a patterned absorber layer, the magnification factor being determined by the optical reduction that is applied by the mirror system of a stepper/scanner, hereafter also referred to simply as a "scanner" for the sake of conciseness. The examples disclosed herein further deform the pattern that is reproduced on the mask with respect to the intended pattern. More precisely, the pattern is deliberately deformed in the 2-dimensional plane of the EUV mask. The deformation of the pattern is based on a previous detection and measurement of the location of multilayer defects on the blank, and intended so that in the deformed pattern, a higher number of detected multilayer defects are covered by absorber material than would be possible by merely shifting or rotating the complete pattern. In some embodiments, all the detected defects are covered. When the pattern is subsequently printed on a semiconductor wafer in a scanner, the scanner operation is modulated so that the deliberate pattern deformation is not reproduced on the wafer.

Figure 1A:
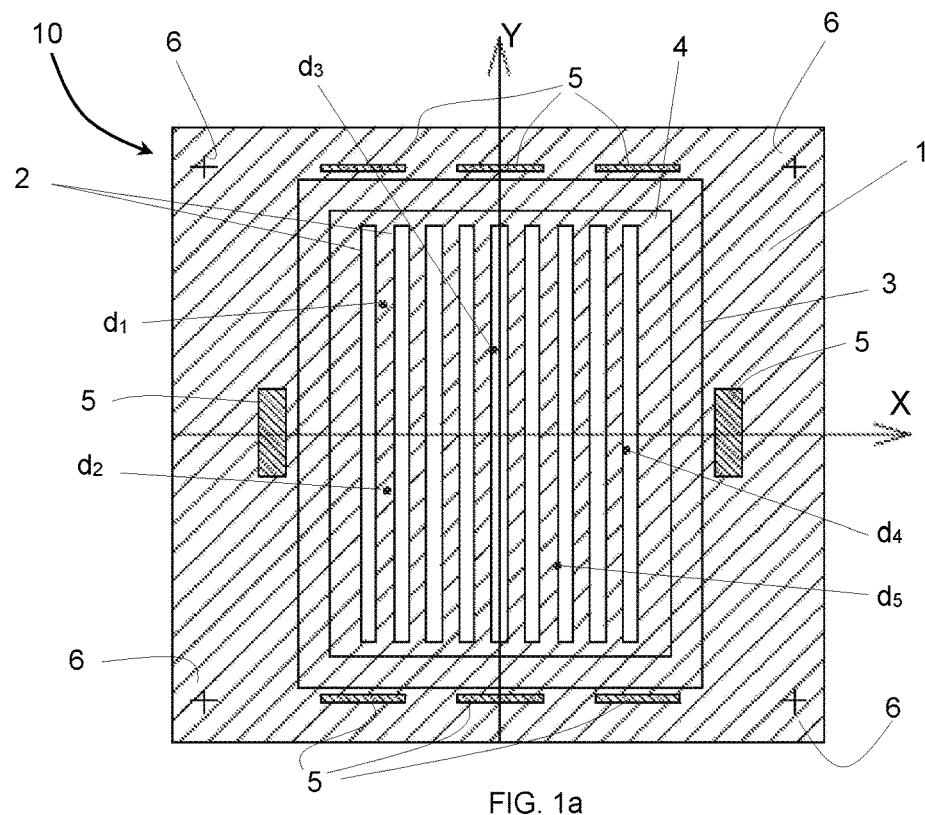
FIGS. 1a to 1c illustrate how a pattern shift or rotation may be used for neutralizing a limited number of multi-layer defects.

FIG. 1a is a schematic view of an EUV mask 10, comprising an EUV blank 1 and a pattern 4 of line-shaped features 2, the features being drawn within a rectangular area 3. The pattern is not drawn to a realistic scale and may be regarded as a portion of a realistic pattern superimposed on the blank, for the purposes of illustration. The area 3 comprises the maximum pattern size and a small tolerance surrounding the maximum pattern size, establishing the maximum area that can be projected onto a wafer when the mask is inserted in a scanner. In other words, the rectangle 3 comprises the totality of any pattern or group of patterns that is to be printed on wafer with the EUV mask 10. The line-shaped features 2 are defined on the mask as areas where no absorber material is present. The majority of the remainder of the mask is covered by absorber material. The mask illustrated in FIG. 1 is therefore what is known as a "darkfield" mask, i.e. the pattern features 2 in the field that are to be printed are not covered by absorber material, and defined as "clear". The opposite is equally possible, i.e. a clear field mask, wherein only the features that are to be printed are defined as absorber-areas. Around the rectangular area 3, a number of alignment marks 5 are produced on the mask. These marks are used for positioning the area 3 (and thereby the pattern 4) in the lithography tool with respect to the wafer onto which the pattern is to be printed. The pattern 4 and the alignment marks 5 may be produced simultaneously on the blank 1 by a known process performed on the multilayer blank with a uniform layer of absorber material deposited on the blank. This process may use a mask writer based on electron beam lithography. The alignment marks 5 are shown in this figure as areas superimposed on the absorber material, but in some embodiments, these marks may be produced as patterned areas of the absorber material.

The EUV blank used for producing a mask is furthermore provided with a number of reference marks, also known as fiducials 6, placed on the four corners of the blank. The fiducials are schematically shown as crosses superimposed on the absorber material, but in reality they may have a particular shape, and they may be formed by patterned areas of the absorber material (they are however produced before producing the pattern 4 and the alignment marks 5). The shape and size of the fiducials 6 is the subject of standardization. Reference is made to SEMI Standard P48-1110 in particular. The fiducials define a spatial reference for accurate positioning of the area 3 (and thereby the pattern 4) and the alignment marks 5 on the blank. The reference may be a 2-dimensional orthogonal coordinate system defined by axes X and Y with the origin in a well-defined position with respect to the fiducials 6. The origin may for example be located in the center of the polygon defined by the fiducials 6. The pattern 4 and the alignment marks 5 are then produced on the blank in a well-defined position with respect to the X-Y axes. In the illustration of FIG. 1a, the area 3 is exactly centered with respect to the fiducials 6. This is however not a strict requirement, as long as the position of the area 3 and thereby the pattern 4 can be accurately referenced with respect to the fiducials 6.

Figure 1B:
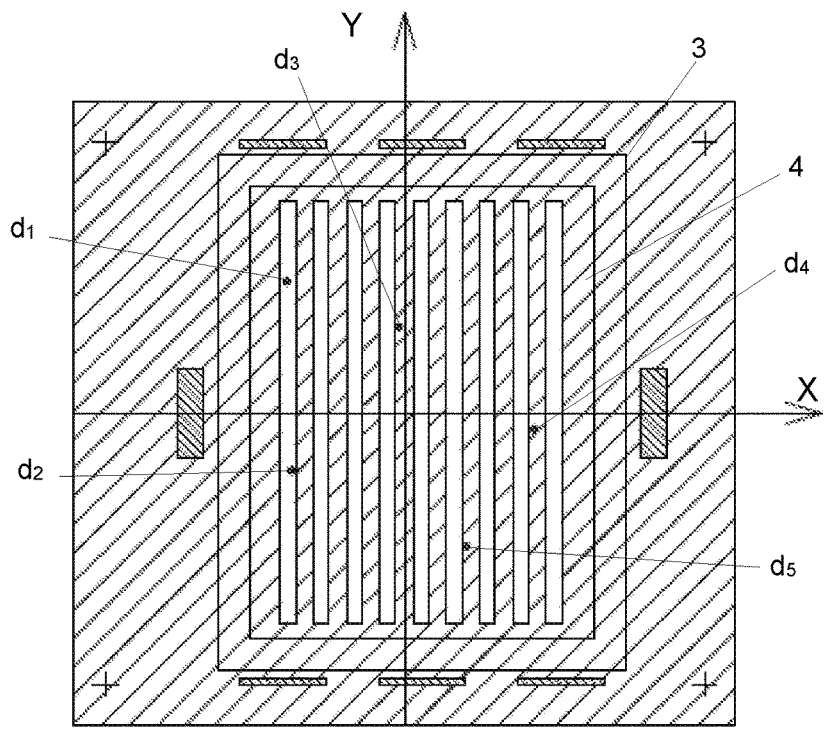
Figure 1C:
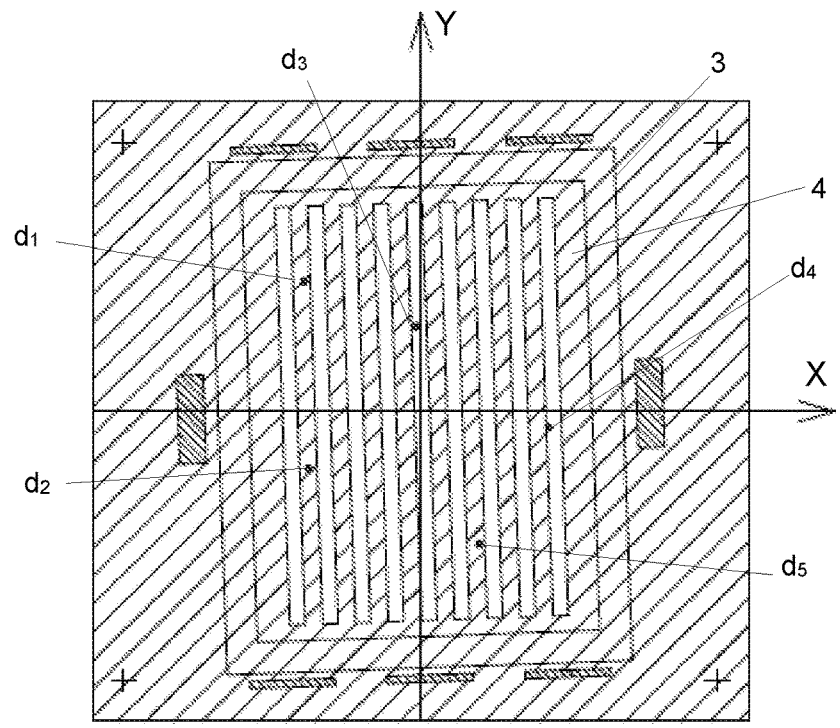

As described in the introductory section, the blank 1 comprises unavoidable multilayer defects. Five multilayer defects d1 to d5 are indicated in the example of FIG. 1a. The defects are assumed here to have approximately the same size. As shown in the figure, defects d1 and d2 are covered by absorber material, whereas d3 to d5 are not. FIGS. 1b and 1c illustrate the technique referred to above and known as the "pattern shift", i.e. the entire area 3 (including the pattern 4) and the alignment marks 5 are translated (FIG. 1b) or rotated (FIG. 1c), with the aim of covering as many defects as possible with absorber material. The extent of the translation & rotation that is practically possible is determined by the mask pattern centrality specifications of the scanner. As seen FIG. 1b, defects d3 to d5 are now covered, however d1 and d2 are no longer covered. So the pattern translation is unable to cover all five defects at the same time. Likewise, as illustrated in FIG. 1c, a rotation of the entire pattern is unable to cover all the defects at the same time.

Figure 2:
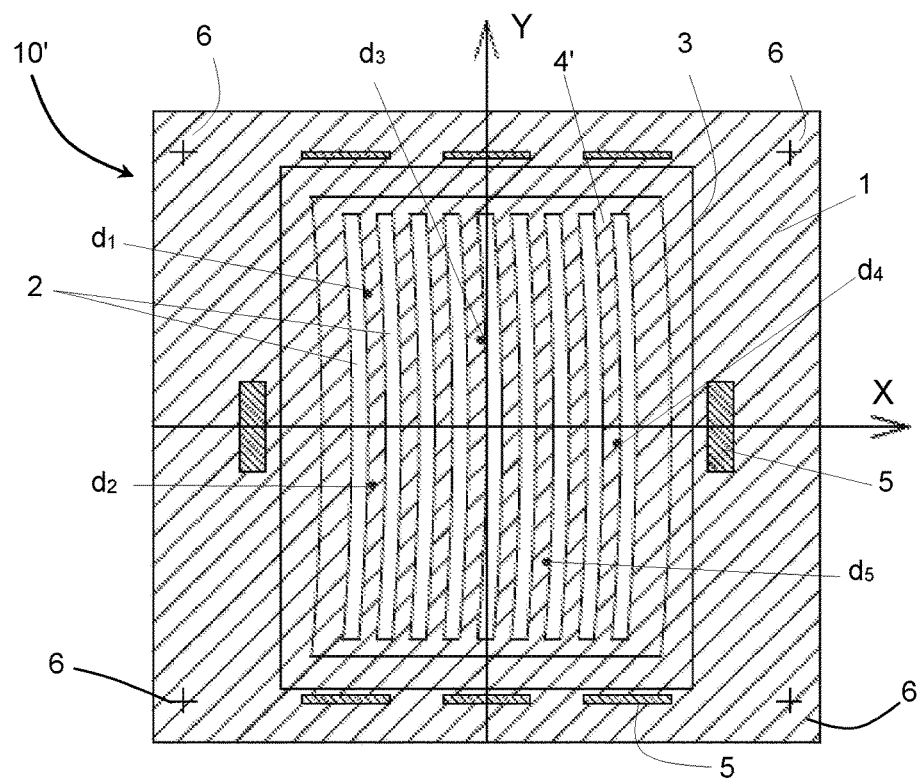
FIG. 2 illustrates how the pattern of FIG. 1 may be adapted, according to an example embodiment.

FIG. 2 shows an EUV mask 10' printing the same pattern as shown in FIG. 1 and produced from the same blank 1 having the same defects d1-d5 and provided with the same fiducials 6. The total pattern 4' of line features 2 has been deliberately deformed by bending the pattern. In the deformed pattern, it is seen that all five defects are covered by absorber material. The rectangular area 3 and the alignment marks 5 are not deformed. The alignment marks 5 continue to play their same role during the lithography process, for aligning the wafer to the EUV mask. In the illustration of FIG. 2, the area 3 is again centered between the fiducials 6, i.e. the pattern 4' is neither shifted nor rotated. However, a deformation of the pattern may be combined with a shift or rotation of the area 3 and the alignment marks 5, as known in the art.

The disclosure is not limited to the example of FIG. 1 where the mask comprises one single pattern 4'. When the area 3 comprises multiple patterns, deformations of each of these patterns (even mutually different) may be combined with the "floorplan" pattern shift known in the art. The first aspect of the disclosure is therefore related to an EUV mask comprising a deformed pattern (one or more), the deformation of the pattern being such that a plurality of ML defects that have been detected in the area of the pattern, are covered by absorber material.

The disclosure is furthermore related to a method of producing the mask. The method comprises the steps of providing a multilayer blank and producing reference marks thereon such as the fiducials 6. The blank comprises a plurality of ML defects. The method furthermore comprises the step of detecting the defects and measuring their position on the blank. The position of the defects is defined by their coordinates in a coordinate system defined with respect to the location of the fiducials 6. This may be the orthogonal X-Y system described above. This position may be determined by measurement tools known in the art.

The deformation with respect to the non-deformed pattern (s) is calculated in such a way that, possibly combined with a translation and/or rotation of the pattern (either a single pattern or one of a plurality of patterns within the area 3), they result in the coverage of a plurality of the detected ML defects by absorber material. When printing the pattern on a semiconductor wafer, the deformation may be compensated by the scanner operation so that this deformation is not reproduced on the wafer. The latter aspect registers the deformation in the form of numerical data that can be read by the control system of the scanner, as will be described in more detail further in this description.

According to an example embodiment, the pattern deformation and, if applicable, translation and/or rotation, is characterized by a coordinate transformation of the coordinates X and Y Translations and/or rotations are zero and first order transformations. Most of the deformations described in this disclosure are characterized by a (combination of) higher order transformation(s). For example, if the bending of the pattern of features 2 illustrated in FIG. 2 takes place according to a parabola-shaped curve, the deformation may be characterized by the transformation formulas:

$$dx = k \cdot y^2 \qquad (1)$$

$$dy = 0 \qquad (2)$$

The coefficient k then represents the numerical data used to define how the intended pattern is deformed. The deformation may be described by more complicated transformations, including third or higher order terms in x or y or mixed terms in x and y. An example would be:

$$dx = k1 + k2 \cdot x + k3 \cdot y^2 + k4 \cdot xy \qquad (3)$$

$$dy = k5 \cdot x + k6 \cdot x^3 + k7 \cdot xy^3 \qquad (4)$$

The term k1 represents a shift (translation) of the pattern in the x-direction. As stated above, this translation may nevertheless be included in a transformation, which furthermore includes a deformation of the pattern, primarily characterized by higher order terms in the polynomial description. The coefficients k2 to k7 represent in this case the numerical data that characterize the deformation of the pattern on the EUV mask. The term dx=k2x represents a magnification of the pattern in the X-direction. The term dx=k4xy is a magnification in the X-direction that increases linearly as a function of Y. The term dy=k5x represents a rotation of the X-axis. The term dy=k6x³ is a 3rd order y-distortion. The term dy=k7xy³ is a rotation of the X-axis that is modulated through the y-direction along a third-order path.

The general formulation of a transformation in X and Y that may characterize a pattern deformation can be written as follows:

$$dx = \sum_{\substack{i=0\ \ldots\ m \\ j=0\ \ldots\ n}} a_{ij} x^i y^j \qquad (5)$$

$$dx = \sum_{\substack{i=0\ \ldots\ p \\ j=0\ \ldots\ s}} b_{ij} x^i y^j \qquad (6)$$

wherein m, n, p and s are integer numbers.

Alternatively, the deformation may be characterized, not by a polynomial with a set of coefficients, but by a data set in the form of a look-up table or alike that defines how a set of individual points within the area 3 (as defined by a given grid in X and Y) are shifted.

Once the deformed pattern is defined and characterized by numerical data, this deformed pattern (one or more) is produced on the blank, by patterning the absorber layer deposited on the blank. A known patterning method involves depositing a resist layer onto the absorber layer, writing the pattern in the resist by a mask writer, thereby fixing resist in areas where the absorber material is to remain on the blank and etching the absorber material not covered by resist, which results in the absorber pattern. The alignment marks 5 may be formed in the same process.

The numerical data which characterize the deformation of the pattern, e.g. the coefficients of the example polynomials of the type (5) and (6), with respect to the intended pattern, is registered in digital form. The deformation of the pattern may be registered in a numerical way in order to realize the reconstruction of the non-distorted pattern on the wafer in an EUV scanner. The scanner may be able to compensate for the deliberate pattern deformation during wafer printing. This concerns a further aspect of the disclosure, namely a method for correctly printing a pattern regardless of the deliberate deformation of the pattern on the EUV mask, and a scanner configured to perform this method.

Figure 3:
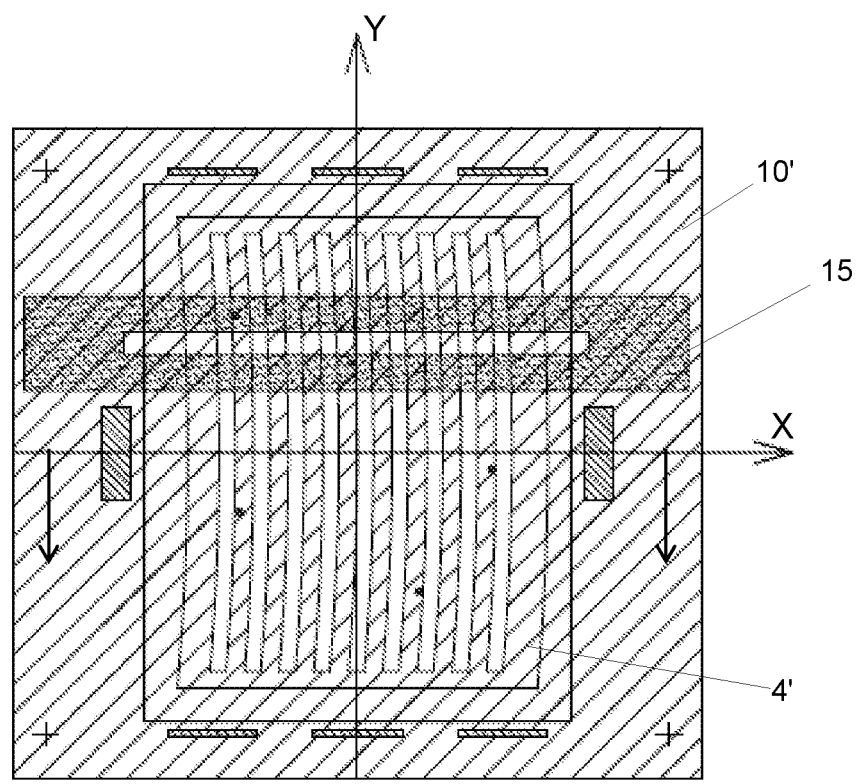
FIG. 3 illustrates the operation of a stepper/scanner for EUV lithography, according to an example embodiment.

A stepper/scanner is a complex lithography system of which the basic components are: a light source, a mask holder, a wafer holder, an exposure slit and an optical assembly comprising a plurality of mirror elements. The wafer holder, the mask holder and a number of mirror elements may be moveable by actuators. The exposure slit is usually stationary, with the mask holder and the wafer holder moving simultaneously relative to the slit in order to effectuate a progressive exposure of the wafer. FIG. 3 illustrates this relative movement of the EUV mask 10' with respect to the exposure slit 15. Further details of such a system and its components are known to the skilled reader and therefore not reproduced here. According to some embodiments, an EUV mask as described above is mounted in the mask holder, and a semiconductor wafer is mounted in the wafer holder. Positioning of the mask relative to the wafer is performed according to known alignment procedures, involving detection of the alignment marks 5 and fine-tuning of the relative positions so that the projected image of the pattern 4' is accurately positioned at a predefined location of the wafer, according to the state-of-the-art methods of alignment.

The actual exposure of the wafer takes place by illuminating the mask with the EUV source so that light is reflected off the areas that do not comprise absorber material, and focused on the wafer by the mirror system. As stated, during exposure a relative movement of the mask and the wafer with respect to the exposure slit is effectuated in order to progressively expose the wafer.

According to an embodiment, the relative movement, during exposure, of the wafer holder, the mask holder, and/or individual mirror elements of the optics system, is controlled in terms of the path and velocity of the movement (s), in such a manner that the intentionally added deformation of the mask pattern is not reproduced on the wafer. In the example of FIG. 3, obtaining a non-deformed pattern may be achieved by subjecting the mask holder and wafer holder to a relative back and forth movement in the x-direction, during their trajectory relative to the stationary slit 15 from the top of the mask to the bottom. The numerical data that characterizes the bending of the pattern features 2 allows to calculate the required movement of the holders in the x-direction as a function of time, in order for the pattern 3 of features 2 to be correctly printed (i.e. not deformed) on the wafer. In addition, movement of mirror elements may be incorporated to nullify the intentional pattern deformation on the mask. The calculation of the required relative movements of the components is straightforward for a skilled person using suitable calculation software, wherein the numerical data characterizing the deformation of the mask pattern is entered as input data.

More complicated relative movements of the various components may be required when the deformation of the pattern is characterized by more complicated transformations, such as given by example formulas (3) and (4). However, each term or combination of terms of these transformations can be translated separately to a suitable relative movement of one or more components of the scanner, and these movements can be applied simultaneously during exposure.

The disclosure is also related to a stepper/scanner that is specifically adapted. A scanner, according to an example embodiment, is provided with a user interface which allows the user to manually enter the numerical data characterizing the deliberate pattern deformation, or to provide the data from an electronic data file. When the deformation is characterized by transformation formulas such as example formulas (1) to (4), these formulas may be entered in the interface manually, for example. The scanner is further equipped with calculation tools in the form of software that calculates the required relative movements of the scanner's moveable components in order for the pattern to be correctly printed on the wafer.

The disclosure is specifically related to a computer-implemented method for calculating the deformation and if applicable translation/rotation of the absorber pattern (one or more). This method comprises the steps of: receiving data which describe an intended pattern that is to be printed on a semiconductor wafer with the use of a stepper/scanner, receiving data related to an EUV blank comprising fiducials 6 and comprising a number of detected ML defects, in particular receiving the position of the detected defects with respect to the fiducials, calculating numerical data which characterize a deliberate deformation of the pattern, and possibly including a translation and/or a rotation of the pattern as a whole, so that when the deformed and possibly translated and/or rotated pattern is defined onto the EUV blank in the form of an absorber pattern, a plurality of the detected defects are covered by absorber material. The disclosure is equally related to a computer program for executing the above method on a computer.

The calculation of the numerical data may involve any of a number of computer-aided strategies. According to some embodiments, an image of the intended pattern, magnified according to the magnification that is to be applied in the scanner, and provided also with an image of the alignment marks 5, is superimposed onto an image of the blank on which the defects have been clearly visualized. A visual interface then allows the user, in addition to shift and/or rotate the pattern and the alignment marks with respect to the image of the ML defects, to apply deformations to the pattern, in order to cover additional defects with absorber material. The user may for example be allowed to enter polynomials of the type given in equations (1) to (4), and see the result of such transformations on the pattern. Or alternatively, the user may be able to deform the pattern graphically, after which a curve-fitting algorithm is run that determines polynomials that best approximate the applied deformations. According to another embodiment applicable for more complex applications, an algorithm is run that automatically calculates coordinate transformations in x and y (see equations (5) and (6)), which result in covering the ML defects with absorber material. The algorithm may for example be designed to systematically calculate the effect of a large number of possible transformations of the type given in equations (1) to (4) and to verify which of these transformations yields the best coverage of the ML defects.

While some embodiments have been illustrated and described in detail in the appended drawings and the foregoing description, such illustration and description are to be considered illustrative and not restrictive. Other variations to the disclosed embodiments can be understood and effected in practicing the claims, from a study of the drawings, the disclosure, and the appended claims. The mere fact that certain measures or features are recited in mutually different dependent claims does not indicate that a combination of these measures or features cannot be used. Any reference signs in the claims should not be construed as limiting the scope.

What is claimed is:

1. A mask for printing a pattern of features onto a semiconductor wafer in a stepper apparatus by EUV lithography, the mask comprising:
    a multilayer blank comprising a plurality of multilayer (ML) defects, the blank further comprising a plurality of reference marks; and
    an absorber pattern positioned in a predefined position with respect to a 2-dimensional coordinate system that is defined by the position of the reference marks, the absorber pattern comprising areas covered by EUV absorber material and areas not covered by the EUV absorber material, the absorber pattern corresponding to an intended pattern of features, wherein the absorber pattern is deliberately deformed on the mask with respect to the intended pattern of features, so that multiple ML defects in the area of the blank corresponding to the pattern of features are covered by absorber material.

2. The mask according to claim 1, wherein the absorber pattern is furthermore shifted or rotated with respect to the 2-dimensional coordinate system.

3. The mask according to claim 1, wherein the deformation of the absorber pattern is characterized by one or more first or higher order transformations of the 2-dimensional coordinate system.

4. The mask according to claim 3, wherein the one or more first or higher order transformations include at least one second or third order transformation.

5. The mask according to claim 1, wherein the 2-dimensional coordinate system is defined by orthogonal X and Y axes.

6. The mask according to claim 1, wherein all ML defects that have been detected in the area of the blank corresponding to the pattern of features are covered by absorber material.

7. A method for producing a mask for EUV lithography, comprising the steps of:
    providing a multilayer blank;
    detecting a plurality of multilayer defects on the blank;
    producing reference marks on the blank;
    defining a 2-dimensional coordinate system with respect to the reference marks;
    determining a position of the defects in the 2-dimensional coordinate system;
    providing a pattern of features that is intended to be printed on a semiconductor wafer;
    determining an absorber pattern comprising areas covered by EUV absorber material and areas not covered by the EUV absorber material, the absorber pattern corresponding to the pattern of features intended to be printed on the wafer, wherein the absorber pattern is deformed with respect to the intended pattern of features, so that multiple ML defects in the area of the blank corresponding to the pattern of features are covered by absorber material, when the absorber pattern is produced on the blank in a predefined position with respect to the 2-dimensional coordinate system;

producing the absorber pattern on the blank, in the predefined position; and registering the deformation of the absorber pattern with respect to the intended pattern of features in the form of numerical data that represents the deformation in the 2-dimensional coordinate system.

8. The method according to claim 7, wherein the absorber pattern is furthermore shifted or rotated with respect to the 2-dimensional coordinate system.

9. The method according to claim 7, wherein the pattern deformation is characterized by one or more first or higher order transformations of the 2-dimensional coordinate system.

10. The method according to claim 9, wherein the one or more first or higher order transformations include at least one second or third order transformation.

11. The method according to claim 7, wherein all of the detected ML defects in the area of the blank corresponding to the pattern of features are covered by absorber material.

12. A method for producing a print of a pattern of features on a semiconductor wafer, the method comprising the steps of:

providing an EUV stepper, the stepper comprising a number of movable components which are movable relative to each other and relative to other components of the stepper, which are stationary;

mounting an EUV mask into a mask holder of the stepper, wherein the EUV mask comprises:

a multilayer blank comprising a plurality of multilayer (ML) defects, the blank further comprising a plurality of reference marks; and an absorber pattern positioned in a predefined position with respect to a 2-dimensional coordinate system that is defined by the position of the reference marks, the absorber pattern comprising areas covered by EUV absorber material and areas not covered by the EUV absorber material, the absorber pattern corresponding to an intended pattern of features, wherein the absorber pattern is deliberately deformed on the mask with respect to the intended pattern of features, so that multiple ML defects in the area of the blank corresponding to the pattern of features are covered by absorber material;

mounting a semiconductor wafer into a wafer holder of the stepper;

aligning the wafer and the EUV mask;

using numerical data representative of a deliberate deformation of the absorber pattern on the EUV mask, with respect to the intended pattern of features, to calculate a required path or velocity of one or more of the moveable components relative to each other or relative to stationary components of the stepper, so that exposure of the wafer yields a printed pattern on the wafer wherein the deformation does not appear; and exposing the wafer whilst subjecting the one or more movable components to the required path or velocity.

13. A stepper for EUV lithography, comprising:

a number of components which are movable relative to each other and relative to other components of the stepper, which are stationary;

an interface for receiving numerical data representative of a deliberate deformation of an absorber pattern on an EUV mask, wherein the EUV mask comprises:

a multilayer blank comprising a plurality of multilayer (ML) defects, the blank further comprising a plurality of reference marks; and an absorber pattern positioned in a predefined position with respect to a 2-dimensional coordinate system that is defined by the position of the reference marks, the absorber pattern comprising areas covered by EUV absorber material and areas not covered by the EUV absorber material, the absorber pattern corresponding to an intended pattern of features, wherein the absorber pattern is deliberately deformed on the mask with respect to the intended pattern of features, so that multiple ML defects in the area of the blank corresponding to the pattern of features are covered by absorber material; and a means for calculating a required path or velocity of one or more of the movable components relative to other moveable components or relative to stationary components of the stepper, in order that exposure of the EUV mask held by a mask holder of the stepper yields a printed pattern on a semiconductor wafer held by a wafer holder of the stepper, wherein the deformation does not appear in the printed pattern.

14. A computer-implemented method for calculating a deformation of an absorber pattern on an EUV mask, comprising the steps of:

receiving data descriptive of a pattern that is intended to be printed on a semiconductor wafer using a stepper;

receiving data descriptive of an EUV blank comprising reference marks and comprising a number of detected ML defects, in particular receiving data related to a position of the detected defects with respect to the reference marks; and calculating data which characterize a deformation of the pattern and possibly a translation or a rotation of the pattern as a whole, so that when the deformed and possibly translated or rotated pattern is produced on the EUV blank, a plurality of the detected defects are covered by absorber material.

15. A tangible, non-transitory computer-readable media comprising instructions encoded therein, wherein the instructions, when executed by one or more processors, cause a computing device to perform the method of claim 14.

* * * * *